(12) United States Patent
Lin et al.

(10) Patent No.: US 10,355,096 B2
(45) Date of Patent: Jul. 16, 2019

(54) HIGH ELECTRON MOBILITY TRANSISTOR DEVICES AND METHOD FOR FABRICATING THE SAME

(71) Applicant: Vanguard International Semiconductor Corporation, Hsinchu (TW)

(72) Inventors: Hsin-Chih Lin, Hsinchu (TW);
Shin-Cheng Lin, Tainan (TW);
Yung-Hao Lin, Jhunan Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/107,058

(22) Filed: Aug. 21, 2018

(65) Prior Publication Data
US 2019/0067431 A1  Feb. 28, 2019

Related U.S. Application Data

(62) Division of application No. 15/692,516, filed on Aug. 31, 2017, now Pat. No. 10,217,831.

(51) Int. Cl.
*H01L 21/84* (2006.01)
*H01L 29/423* (2006.01)
(Continued)

(52) U.S. Cl.
CPC .... *H01L 29/4236* (2013.01); *H01L 21/26546* (2013.01); *H01L 29/41766* (2013.01);
(Continued)

(58) Field of Classification Search
CPC .......... H01L 29/7835; H01L 29/42368; H01L 29/66659; H01L 29/66681; H01L 29/7816; H01L 29/1095; H01L 29/0634; H01L 29/0653; H01L 29/1045; H01L 29/0847; H01L 29/66462; H01L 29/086;
(Continued)

(56) References Cited

U.S. PATENT DOCUMENTS 7,701,000 B2   4/2010  Park
8,264,035 B2   9/2012  Hsieh
(Continued)

FOREIGN PATENT DOCUMENTS

| TW | 201413952 A | 4/2014 |
| TW | 201511264 A | 3/2015 |
| TW | 201714302 A | 4/2017 |

OTHER PUBLICATIONS

Taiwanese Office Action and Search Report for Application No. 106122196, dated Feb. 22, 2018.

*Primary Examiner* — Robert G Bachner
(74) *Attorney, Agent, or Firm* — Birch, Stewart, Kolasch & Birch, LLP

(57) ABSTRACT

A HEMT device is provided. The HEMT device includes a substrate, a first epitaxial layer, a second epitaxial layer, an insulating layer, a gate, a source, and a drain. The first epitaxial layer is formed on the substrate. The second epitaxial layer is formed on the first epitaxial layer. The insulating layer is formed on the second epitaxial layer. The gate is formed in the insulating layer and extends into the second epitaxial layer. The source and the drain are formed in the insulating layer and extend into the second epitaxial layer, wherein the source and the drain are located on both sides of the gate.

12 Claims, 7 Drawing Sheets

(51) Int. Cl.
  *H01L 29/778* (2006.01)
  *H01L 29/66* (2006.01)
  *H01L 21/265* (2006.01)
  *H01L 29/417* (2006.01)
  *H01L 29/36* (2006.01)
  *H01L 29/20* (2006.01)

(52) U.S. Cl.
  CPC .. *H01L 29/42316* (2013.01); *H01L 29/66462* (2013.01); *H01L 29/7786* (2013.01); *H01L 29/7787* (2013.01); *H01L 29/2003* (2013.01); *H01L 29/365* (2013.01); *H01L 29/66431* (2013.01); *H01L 29/778* (2013.01); *H01L 29/7782* (2013.01); *H01L 29/7783* (2013.01); *H01L 29/7784* (2013.01); *H01L 29/7785* (2013.01)

(58) Field of Classification Search
  CPC ............. H01L 29/0878; H01L 29/7823; H01L 29/0865; H01L 29/7786; H01L 29/0623; H01L 29/2003; H01L 29/063; H01L 29/1083; H01L 21/2652; H01L 29/0882; H01L 21/26513; H01L 29/0619; F04D 25/105; F04D 25/0693; F04D 27/004; H02M 1/08; H02M 1/088; H02M 2001/0003; H02M 3/1582; H02M 3/1584; H02M 3/1588
  See application file for complete search history.

(56) References Cited

U.S. PATENT DOCUMENTS

| | | |
|---|---|---|
| 8,674,407 B2 | 3/2014 | Ando et al. |
| 2012/0235210 A1 | 9/2012 | Takemae et al. |
| 2014/0231883 A1 | 8/2014 | Esteve et al. |
| 2014/0367743 A1 | 12/2014 | Inoue et al. |
| 2015/0243758 A1 | 8/2015 | Nie et al. |
| 2016/0099351 A1 | 4/2016 | Hebert et al. |
| 2017/0263700 A1 | 9/2017 | Stoffels et al. |
| 2018/0026106 A1 | 1/2018 | Yeh et al. |

HIGH ELECTRON MOBILITY TRANSISTOR DEVICES AND METHOD FOR FABRICATING THE SAME

CROSS REFERENCE TO RELATED APPLICATIONS

This Application is a Divisional Application of U.S. application Ser. No. 15/692,516, filed on Aug. 31, 2017, the entirety of which is incorporated by reference herein.

TECHNICAL FIELD

The technical field relates to a HEMT device with uniformity of gate recess structures.

BACKGROUND

High electron mobility transistor (HEMT) devices with gate recess structures are one of many HEMT device types and are widely used in the industry. In such device structures, the depth of the gate electrode recessed into the epitaxial layer is altered to reduce the density of the two-dimensional electron cloud. However, the difficulty in such manufacturing processes is how to accurately control the uniformity of the gate recess depth on the entire wafer. Whether the gate recess depth is uniform or not will affect the performance and the overall electrical properties.

Therefore, development of a HEMT device with uniformity of gate recess structures is desirable.

SUMMARY

In accordance with one embodiment of the disclosure, a HEMT device is provided. The HEMT device comprises a substrate, a first epitaxial layer, a second epitaxial layer, an insulating layer, a gate, a source, and a drain. The first epitaxial layer is formed on the substrate. The second epitaxial layer is formed on the first epitaxial layer. The insulating layer is formed on the second epitaxial layer. The gate is formed in the insulating layer and extends into the second epitaxial layer. The source and the drain are formed in the insulating layer and extend into the second epitaxial layer. The source and the drain are located on both sides of the gate.

In accordance with some embodiments, the first epitaxial layer is a gallium nitride layer.

In accordance with some embodiments, the second epitaxial layer is a gallium aluminum nitride layer.

In accordance with some embodiments, the insulating layer is a silicon oxide layer, a silicon nitride layer, or a silicon oxynitride layer.

In accordance with some embodiments, the distance between the bottom of the gate and the surface of the second epitaxial layer is defined as a first depth, and the distance between the bottom of the source and the drain and the surface of the second epitaxial layer is defined as a second depth.

In accordance with some embodiments, the first depth is greater than the second depth.

In accordance with some embodiments, the first depth is less than the second depth.

In accordance with some embodiments, the first depth is equal to the second depth.

In accordance with some embodiments, the angle between the bottom and the sidewall of the gate is greater than or equal to 90 degrees.

In accordance with some embodiments, the angle between the bottom and the sidewall of the source and the drain is greater than or equal to 90 degrees.

In accordance with one embodiment of the disclosure, a method for fabricating a HEMT device is provided. The method comprises the following steps. A substrate is provided. A first epitaxial layer is formed on the substrate. A second epitaxial layer is formed on the first epitaxial layer. An insulating layer is formed on the second epitaxial layer. A first implantation process is performed on the second epitaxial layer to form a first implant region in the second epitaxial layer. A second implantation process is performed on the second epitaxial layer to form a plurality of second implant regions in the second epitaxial layer. The second implant regions are located on both sides of the first implant region. The insulating layer and the first implant region and the second implant regions in the second epitaxial layer are etched to form a first trench and a plurality of second trenches. The second trenches are located on both sides of the first trench. A gate is formed in the first trench. A source and a drain are formed in the second trenches.

In accordance with some embodiments, dopants implanted by the first and second implantation processes comprise nitrogen atoms, oxygen atoms, argon atoms, silicon atoms, or carbon atoms.

In accordance with some embodiments, the first implant region has a first depth, and the second implant region has a second depth.

In accordance with some embodiments, the first depth is greater than the second depth.

In accordance with some embodiments, the first depth is less than the second depth.

In accordance with some embodiments, the first depth is equal to the second depth.

In accordance with some embodiments, the first implant region has an implant concentration ranging from 1E10 to 1E16.

In accordance with some embodiments, the second implant region has an implant concentration ranging from 1E10 to 1E16.

In accordance with some embodiments, the angle between the bottom and the sidewall of the first trench is greater than or equal to 90 degrees.

In accordance with some embodiments, the angle between the bottom and the sidewall of the second trench is greater than or equal to 90 degrees.

In the disclosure, before the etching process is performed, the implantation process is introduced. Dopants such as nitrogen atoms or oxygen atoms are implanted into the second epitaxial layer below the insulating layer to a proper depth range (i.e., the depth of the subsequent gate recess) in order to form an amorphous implant region in the second epitaxial layer. When the etching process is performed, since there is a significant difference of the etching rate between the amorphous implant region and its surrounding monocrystalline region, the etching process will be successfully terminated at the bottom of the implant region. The expected etching depth in the second epitaxial layer is thus accurately controlled, that is, the depth of the subsequent gate recess.

In addition, since the distribution of the etching rate on the entire wafer has a tendency to decrease from the center point towards the edge thereof in the manufacturing process, the limitations of the manufacturing process are effectively compensated by the aforementioned manner which generates the difference of the etching rate by the implantation process to precisely control the end point of the etching, avoiding formation of the over-etching phenomenon in the center point of the wafer. The deviation rate of the etching depth among the relative positions of individual gate on the entire wafer is controlled within about 3-5% to achieve the uniformity of the gate recess on the entire wafer. Likewise, the source and the drain are also fabricated by the aforementioned manner to achieve the uniformity of the source/drain recess on the entire wafer, resulting in a desired electrical performance.

Furthermore, by the manufacturing method of the disclosure, an angle closed to 90 degrees is formed between the bottom and the sidewall of the first trench (for subsequent disposition of the gate) and the second trenches (for subsequent disposition of the source and the drain), that is, the trenches appear to have a flat bottom. When the electrode is subsequently filled into the trenches, the formed electric field will appear evenly distributed, while ensuring the operation quality of the components which are used over a long period. However, in a conventional manufacturing process in which only an etching process is performed without implementation of the implantation process, sharp corners appear between the bottom and the sidewall of the fabricated trenches. When the electrode is subsequently filled into the trenches, since the formed electric field is too concentrated on the sharp corners, after a long period of use, the structure here will become very easy to crack, affecting the quality of the components. Therefore, the fabrication method of the disclosure also addresses the limitations of the conventional etching process.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
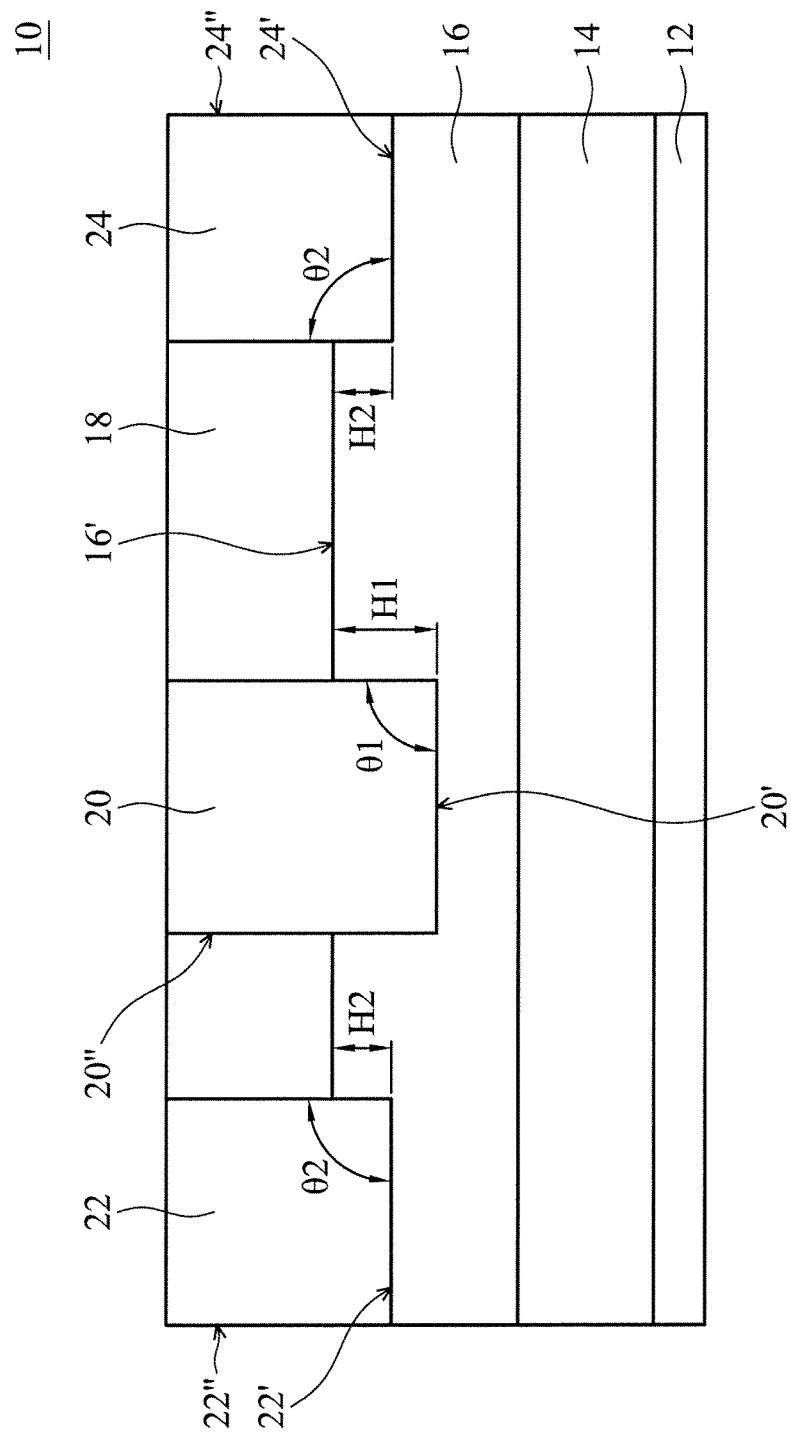
FIG. 1 is a cross-sectional view of a HEMT device in accordance with one embodiment of the disclosure.

Referring to FIG. 1, in accordance with one embodiment of the disclosure, a high electron mobility transistor (HEMT) device 10 is provided. FIG. 1 is a cross-sectional view of the HEMT device 10.

As shown in FIG. 1, in this embodiment, the HEMT device 10 comprises a substrate 12, a first epitaxial layer 14, a second epitaxial layer 16, an insulating layer 18, a gate 20, a source 22, and a drain 24. The first epitaxial layer 14 is formed on the substrate 12. The second epitaxial layer 16 is formed on the first epitaxial layer 14. The insulating layer 18 is formed on the second epitaxial layer 16. The gate 20 is formed in the insulating layer 18 and extends into the second epitaxial layer 16. The source 22 and the drain 24 are formed in the insulating layer 18 and extend into the second epitaxial layer 16. The source 22 and the drain 24 are located on both sides of the gate 20.

In some embodiments, the first epitaxial layer 14 may be a gallium nitride (GaN) layer.

In some embodiments, the second epitaxial layer 16 may be a gallium aluminum nitride (GaAlN) layer.

In some embodiments, the insulating layer 18 may be a silicon oxide layer, a silicon nitride layer, or a silicon oxynitride layer.

In some embodiments, the distance between the bottom 20' of the gate 20 and the surface 16' of the second epitaxial layer 16 is defined as a first depth H1. The distance between the bottom 22' of the source 22 and the surface 16' of the second epitaxial layer 16 is defined as a second depth H2. Additionally, the distance between the bottom 24' of the drain 24 and the surface 16' of the second epitaxial layer 16 is also defined as the second depth H2.

In this embodiment, the first depth H1 is greater than the second depth H2. However, the magnitude of the first depth H1 and the second depth H2 or the relative relationship therebetween may be adjusted in accordance with the demands of the manufacturing process.

In some embodiments, the angle θ1 between the bottom 20' and the sidewall 20" of the gate 20 is greater than or equal to 90 degrees.

In some embodiments, the gate 20 appears to have a flat bottom.

In some embodiments, the angle θ2 between the bottom 22' and the sidewall 22" of the source 22 is greater than or equal to 90 degrees. Similarly, the angle between the bottom 24' and the sidewall 24" of the drain 24 is also defined as θ2 and is greater than or equal to 90 degrees.

In some embodiments, the source 22 and the drain 24 appear to have a flat bottom.

Figure 2:
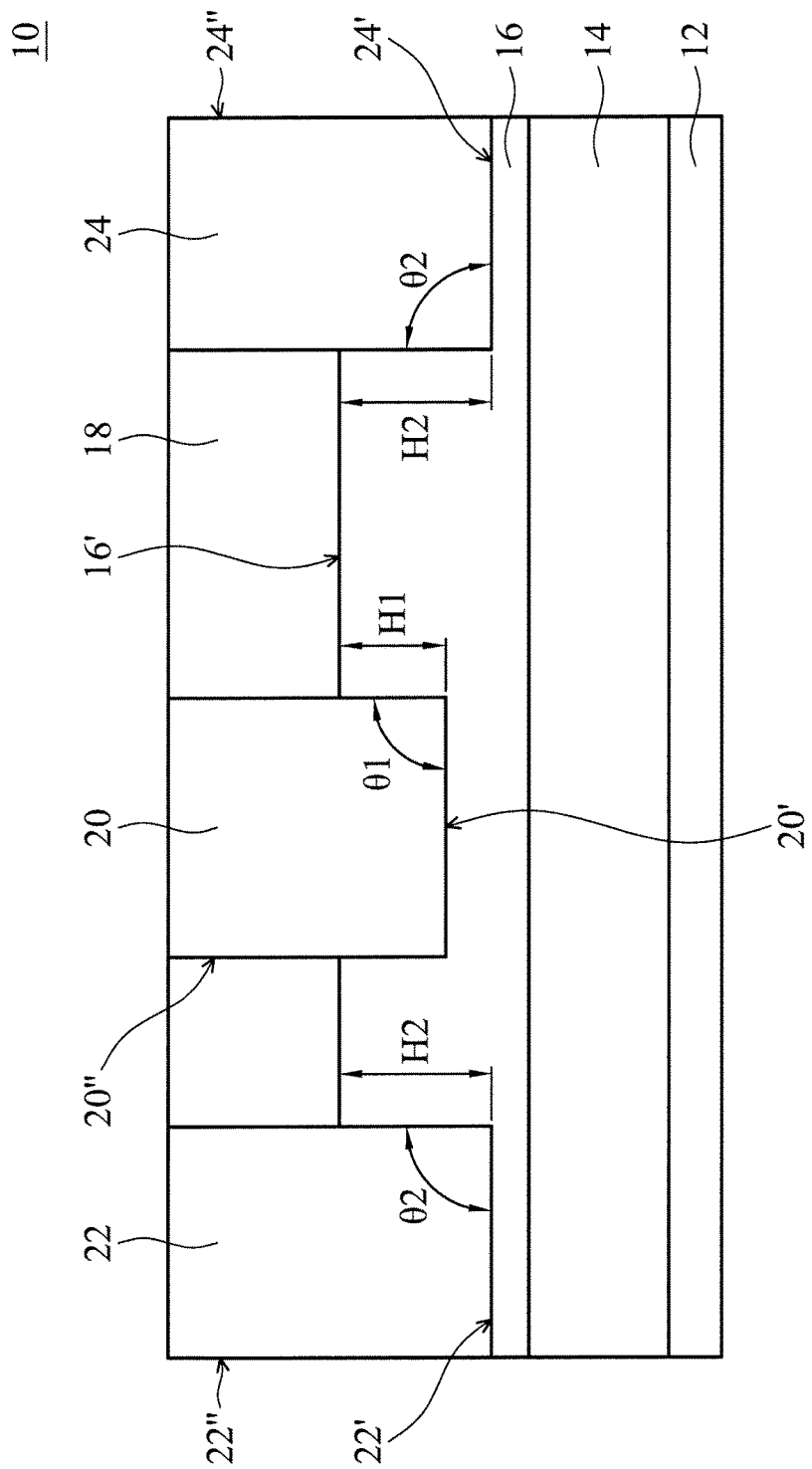
FIG. 2 is a cross-sectional view of a HEMT device in accordance with one embodiment of the disclosure.

Referring to FIG. 2, in accordance with one embodiment of the disclosure, a high electron mobility transistor (HEMT) device 10 is provided. FIG. 2 is a cross-sectional view of the HEMT device 10.

As shown in FIG. 2, in this embodiment, the HEMT device 10 comprises a substrate 12, a first epitaxial layer 14, a second epitaxial layer 16, an insulating layer 18, a gate 20, a source 22, and a drain 24. The first epitaxial layer 14 is formed on the substrate 12. The second epitaxial layer 16 is formed on the first epitaxial layer 14. The insulating layer 18 is formed on the second epitaxial layer 16. The gate 20 is formed in the insulating layer 18 and extends into the second epitaxial layer 16. The source 22 and the drain 24 are formed in the insulating layer 18 and extend into the second epitaxial layer 16. The source 22 and the drain 24 are located on both sides of the gate 20.

In some embodiments, the first epitaxial layer 14 may be a gallium nitride (GaN) layer.

In some embodiments, the second epitaxial layer 16 may be a gallium aluminum nitride (GaAlN) layer.

In some embodiments, the insulating layer 18 may be a silicon oxide layer, a silicon nitride layer, or a silicon oxynitride layer.

In some embodiments, the distance between the bottom 20' of the gate 20 and the surface 16' of the second epitaxial layer 16 is defined as a first depth H1. The distance between the bottom 22' of the source 22 and the surface 16' of the second epitaxial layer 16 is defined as a second depth H2. Additionally, the distance between the bottom 24' of the drain 24 and the surface 16' of the second epitaxial layer 16 is also defined as the second depth H2.

In this embodiment, the first depth H1 is less than the second depth H2. However, the magnitude of the first depth H1 and the second depth H2 or the relative relationship therebetween may be adjusted in accordance with the demands of the manufacturing process.

In some embodiments, the angle θ1 between the bottom 20' and the sidewall 20" of the gate 20 is greater than or equal to 90 degrees.

In some embodiments, the gate 20 appears to have a flat bottom.

In some embodiments, the angle θ2 between the bottom 22' and the sidewall 22" of the source 22 is greater than or equal to 90 degrees. Similarly, the angle between the bottom 24' and the sidewall 24" of the drain 24 is also defined as θ2 and is greater than or equal to 90 degrees.

In some embodiments, the source 22 and the drain 24 appear to have a flat bottom.

Figure 3:
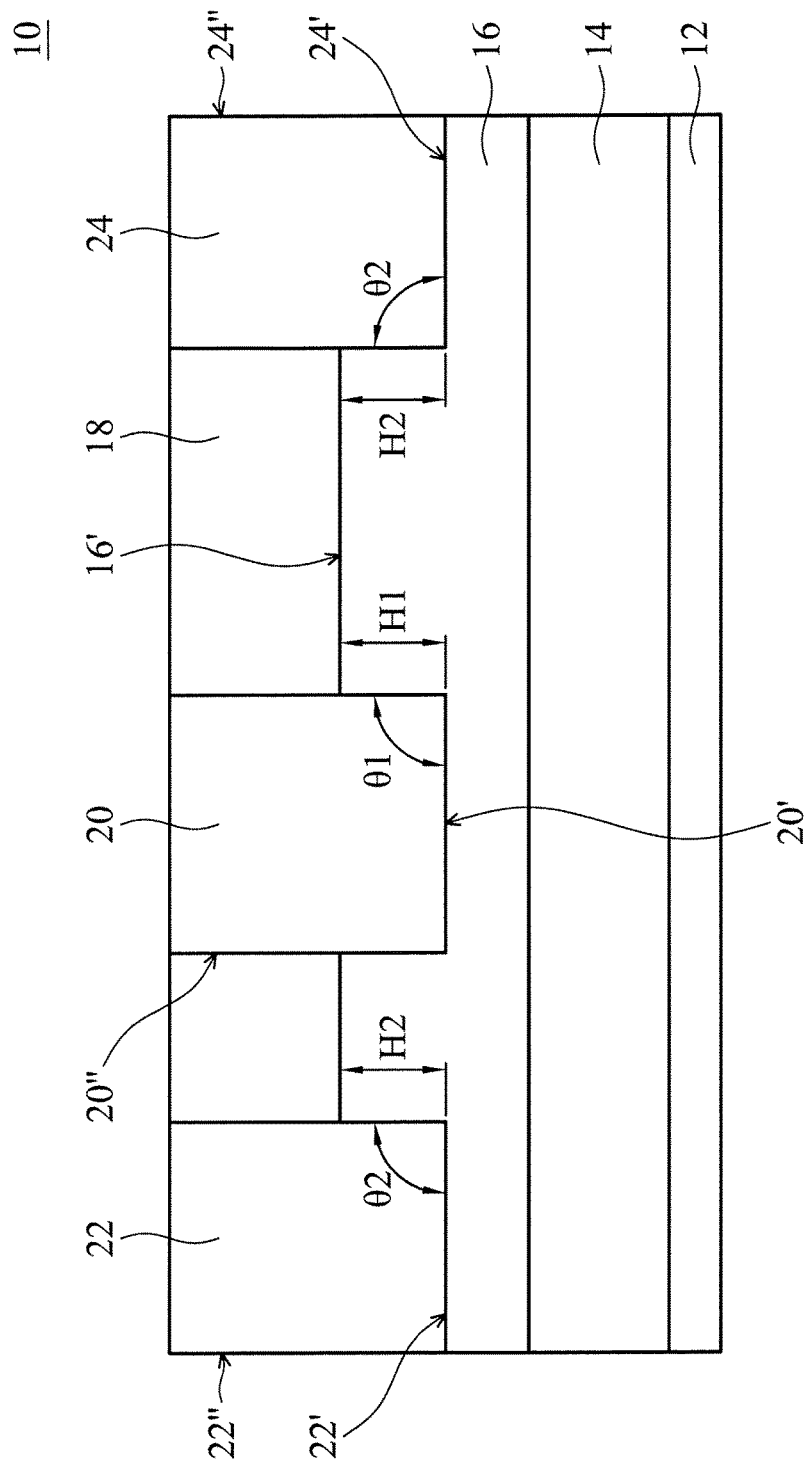
FIG. 3 is a cross-sectional view of a HEMT device in accordance with one embodiment of the disclosure.

Referring to FIG. 3, in accordance with one embodiment of the disclosure, a high electron mobility transistor (HEMT) device 10 is provided. FIG. 3 is a cross-sectional view of the HEMT device 10.

As shown in FIG. 3, in this embodiment, the HEMT device 10 comprises a substrate 12, a first epitaxial layer 14, a second epitaxial layer 16, an insulating layer 18, a gate 20, a source 22, and a drain 24. The first epitaxial layer 14 is formed on the substrate 12. The second epitaxial layer 16 is formed on the first epitaxial layer 14. The insulating layer 18 is formed on the second epitaxial layer 16. The gate 20 is formed in the insulating layer 18 and extends into the second epitaxial layer 16. The source 22 and the drain 24 are formed in the insulating layer 18 and extend into the second epitaxial layer 16. The source 22 and the drain 24 are located on both sides of the gate 20.

In some embodiments, the first epitaxial layer 14 may be a gallium nitride (GaN) layer.

In some embodiments, the second epitaxial layer 16 may be a gallium aluminum nitride (GaAlN) layer.

In some embodiments, the insulating layer 18 may be a silicon oxide layer, a silicon nitride layer, or a silicon oxynitride layer.

In some embodiments, the distance between the bottom 20' of the gate 20 and the surface 16' of the second epitaxial layer 16 is defined as a first depth H1. The distance between the bottom 22' of the source 22 and the surface 16' of the second epitaxial layer 16 is defined as a second depth H2. Additionally, the distance between the bottom 24' of the drain 24 and the surface 16' of the second epitaxial layer 16 is also defined as the second depth H2.

In this embodiment, the first depth H1 is equal to the second depth H2.

However, the magnitude of the first depth H1 and the second depth H2 or the relative relationship therebetween may be adjusted in accordance with the demands of the manufacturing process.

In some embodiments, the angle θ1 between the bottom 20' and the sidewall 20" of the gate 20 is greater than or equal to 90 degrees.

In some embodiments, the gate 20 appears to have a flat bottom.

In some embodiments, the angle θ2 between the bottom 22' and the sidewall 22" of the source 22 is greater than or equal to 90 degrees. Similarly, the angle between the bottom 24' and the sidewall 24" of the drain 24 is also defined as θ2 and is greater than or equal to 90 degrees.

In some embodiments, the source 22 and the drain 24 appear to have a flat bottom.

Referring to FIGS. 4A-4D, in accordance with one embodiment of the disclosure, a method for fabricating a high electron mobility transistor (HEMT) device 10 is provided. FIGS. 4A-4D are cross-sectional views of the method for fabricating a HEMT device 10.

Figure 4A:
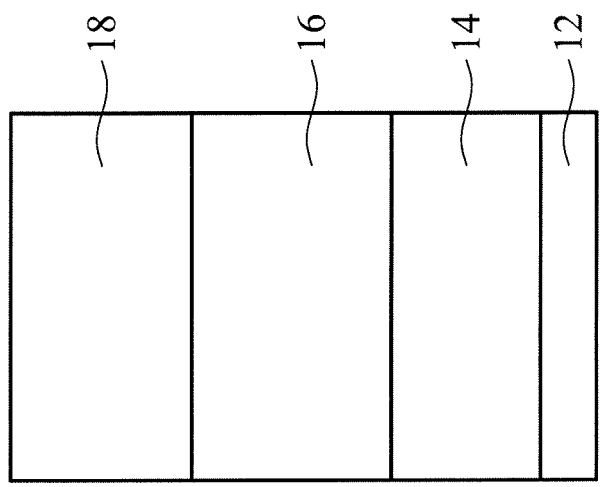
FIGS. 4A-4D are cross-sectional views of a method for fabricating a HEMT device in accordance with one embodiment of the disclosure.

As shown in FIG. 4A, a substrate 12 is provided. In detail, a first epitaxial layer 14, a second epitaxial layer 16, and an insulating layer 18 are formed on the substrate 12 in order.

In some embodiments, the first epitaxial layer 14 may be a gallium nitride (GaN) layer.

In some embodiments, the second epitaxial layer 16 may be a gallium aluminum nitride (GaAlN) layer.

In some embodiments, the insulating layer 18 may be a silicon oxide layer, a silicon nitride layer, or a silicon oxynitride layer.

Figure 4B:
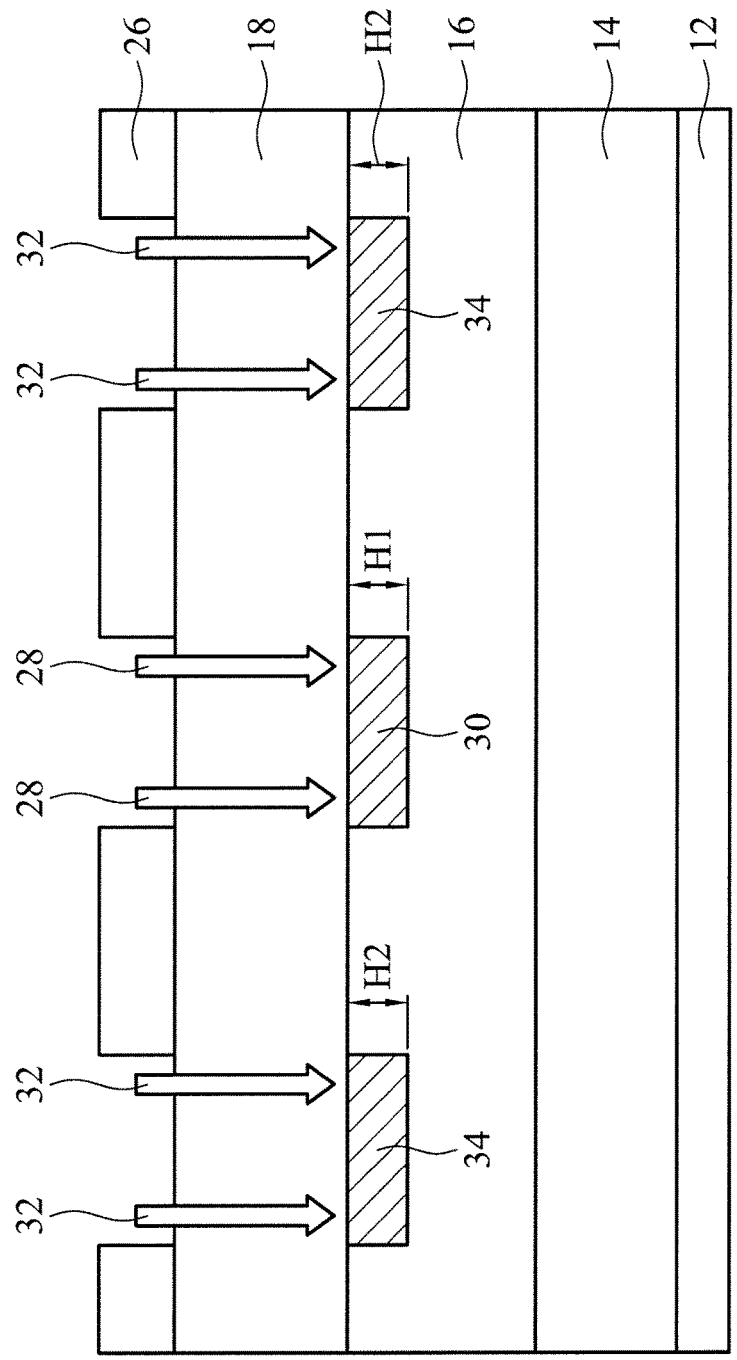

Next, referring to FIG. 4B, a patterned photoresist layer 26 is formed on the insulating layer 18. The locations of implant regions subsequently to be defined are exposed.

Next, a first implantation process 28 is performed on the second epitaxial layer 16 to form a first implant region 30 in the second epitaxial layer 16.

In some embodiments, the dopants implanted by the first implantation process 28 may comprise nitrogen atoms, oxygen atoms, argon atoms, silicon atoms, or carbon atoms.

In some embodiments, the first implant region 30 has a first depth H1.

In some embodiments, the first implant region 30 has an implant concentration ranging from 1E10 to 1E16.

Next, still referring to FIG. 4B, a second implantation process 32 is performed on the second epitaxial layer 16 to form a plurality of second implant regions 34 in the second epitaxial layer 16. The second implant regions 34 are located on both sides of the first implant region 30.

In some embodiments, the dopants implanted by the second implantation process 32 may comprise nitrogen atoms, oxygen atoms, argon atoms, silicon atoms, or carbon atoms.

In some embodiments, the second implant region 34 has a second depth H2.

In this embodiment, the first depth H1 of the first implant region 30 is equal to the second depth H2 of the second implant region 34.

In some embodiments, the first depth H1 may be greater than the second depth H2.

In some embodiments, the first depth H1 may be less than the second depth H2. However, the magnitude of the first depth H1 and the second depth H2 or the relative relationship therebetween may be adjusted in accordance with the demands of the manufacturing process.

In some embodiments, the second implant region 34 has an implant concentration ranging from 1E10 to 1E16.

Figure 4C:
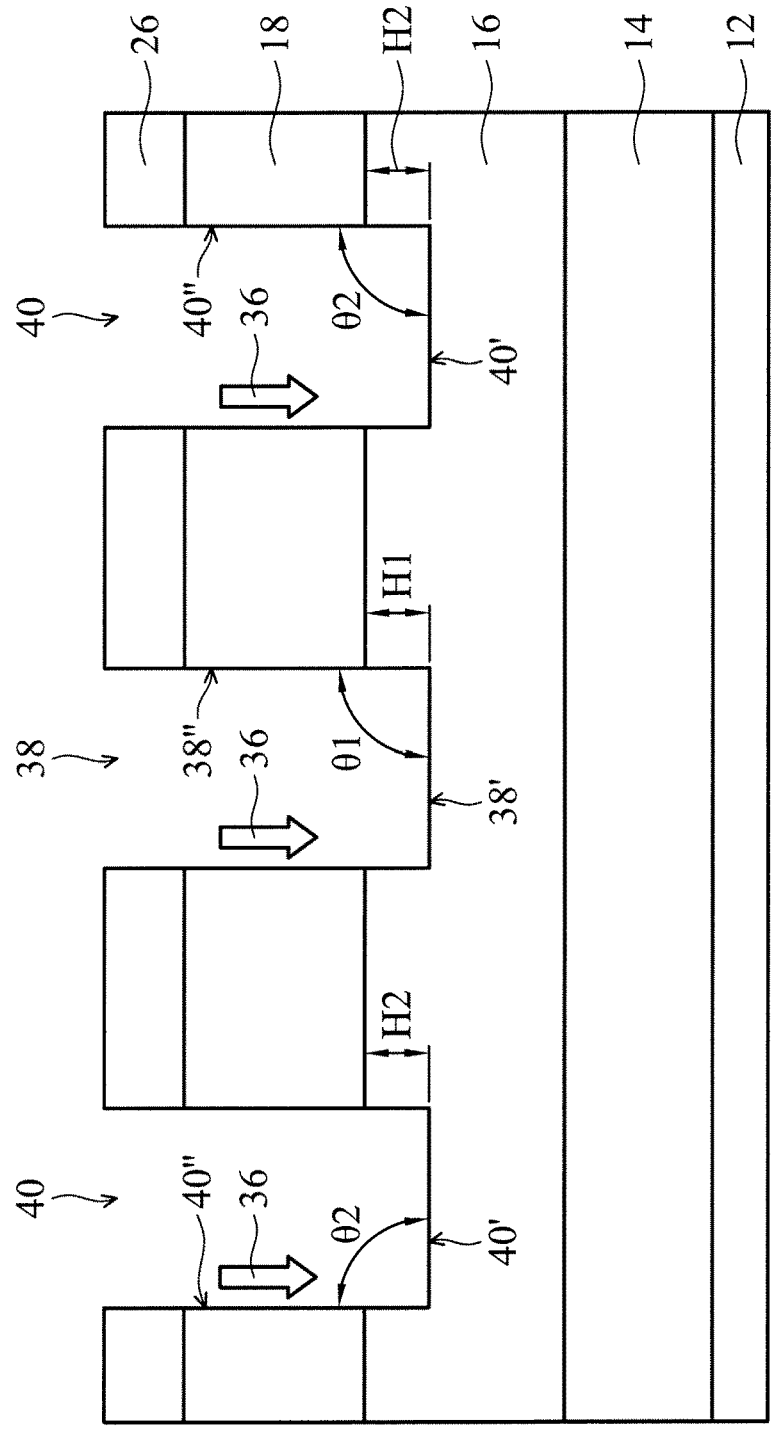

Next, referring to FIG. 4C, an etching process 36 is performed on the insulating layer 18 and the first implant region 30 and the second implant regions 34 in the second epitaxial layer 16 to form a first trench 38 and a plurality of second trenches 40. The second trenches 40 are located on both sides of the first trench 38.

In some embodiments, the angle θ1 between the bottom 38' and the sidewall 38" of the first trench 38 is greater than or equal to 90 degrees.

In some embodiments, the first trench 38 appears to have a flat bottom.

In some embodiments, the angle θ2 between the bottom 40' and the sidewall 40" of the second trench 40 is greater than or equal to 90 degrees.

In some embodiments, the second trench 40 appears to have a flat bottom.

Figure 4D:
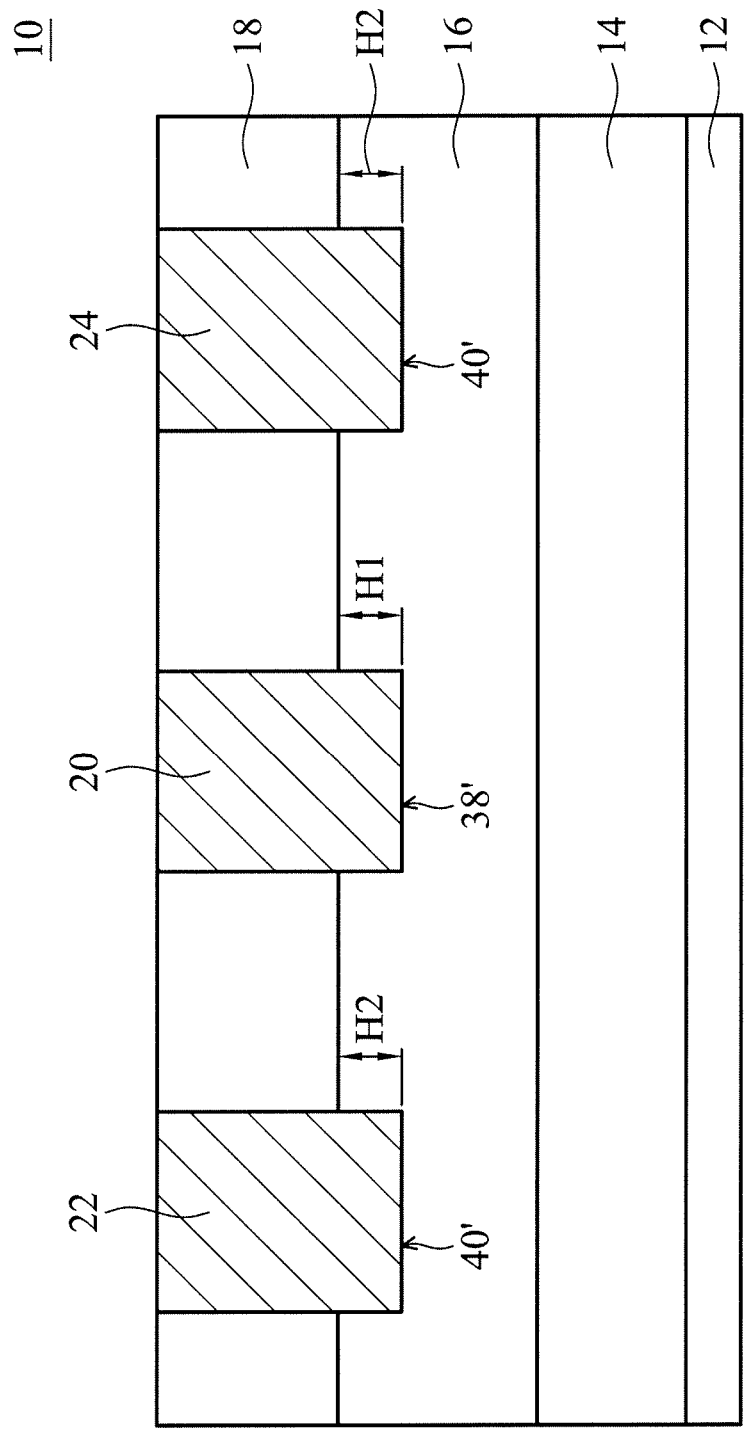

Next, referring to FIG. 4D, a gate 20 is formed in the first trench 38. A source 22 and a drain 24 are formed in the second trenches 40. After removal of the patterned photoresist layer 26, the fabrication of the HEMT device 10 of this embodiment is completed.

In the disclosure, before the etching process is performed, the implantation process is introduced. Dopants such as nitrogen atoms or oxygen atoms are implanted into the second epitaxial layer below the insulating layer to a proper depth range (i.e., the depth of the subsequent gate recess) in order to form an amorphous implant region in the second epitaxial layer. When the etching process is performed, since there is a significant difference of the etching rate between the amorphous implant region and its surrounding monocrystalline region, the etching process will be successfully terminated at the bottom of the implant region. The expected etching depth in the second epitaxial layer is thus accurately controlled, that is, the depth of the subsequent gate recess.

In addition, since the distribution of the etching rate on the entire wafer has a tendency to decrease from the center point towards the edge thereof in the manufacturing process, the limitations of the manufacturing process are effectively compensated by the aforementioned manner which generates the difference of the etching rate by the implantation process to precisely control the end point of the etching, avoiding formation of the over-etching phenomenon in the center point of the wafer. The deviation rate of the etching depth among the relative positions of individual gate on the entire wafer is controlled within about 3-5% to achieve the uniformity of the gate recess on the entire wafer. Likewise, the source and the drain are also fabricated by the aforementioned manner to achieve the uniformity of the source/drain recess on the entire wafer, resulting in a desired electrical performance.

Furthermore, by the manufacturing method of the disclosure, an angle closed to 90 degrees is formed between the bottom and the sidewall of the first trench (for subsequent disposition of the gate) and the second trenches (for subsequent disposition of the source and the drain), that is, the trenches appear to have a flat bottom. When the electrode is subsequently filled into the trenches, the formed electric field will appear evenly distributed, while ensuring the operation quality of the components which are used over a long period. However, in the conventional manufacturing process in which only the etching process is performed without implementation of the implantation process, sharp corners appear between the bottom and the sidewall of the fabricated trenches. When the electrode is subsequently filled into the trenches, since the formed electric field is too concentrated on the sharp corners, after a long period of use, the structure here will become very easy to crack, affecting the quality of the components. Therefore, the fabrication method of the disclosure also addresses the limitations of the conventional etching process.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a HEMT device, comprising:
providing a substrate;
forming a first epitaxial layer on the substrate;
forming a second epitaxial layer on the first epitaxial layer;
forming an insulating layer on the second epitaxial layer;
performing a first implantation process on the second epitaxial layer to form a first implant region in the second epitaxial layer;
performing a second implantation process on the second epitaxial layer to form a plurality of second implant regions in the second epitaxial layer, wherein the second implant regions are located on both sides of the first implant region;
etching the insulating layer and the first implant region and the second implant regions in the second epitaxial layer to form a first trench having a bottom and a sidewall and a plurality of second trenches having a bottom and a sidewall, wherein the second trenches are located on both sides of the first trench;
forming a gate in the first trench; and
forming a source and a drain in the second trenches.

2. The method for fabricating a HEMT device as claimed in claim 1, wherein the first epitaxial layer is a gallium nitride layer.

3. The method for fabricating a HEMT device as claimed in claim 1, wherein the second epitaxial layer is a gallium aluminum nitride layer.

4. The method for fabricating a HEMT device as claimed in claim 1, wherein dopants implanted by the first and second implantation processes comprise nitrogen atoms, oxygen atoms, argon atoms, silicon atoms, or carbon atoms.

5. The method for fabricating a HEMT device as claimed in claim 1, wherein the first implant region has a first depth, and the second implant region has a second depth.

6. The method for fabricating a HEMT device as claimed in claim 5, wherein the first depth is greater than the second depth.

7. The method for fabricating a HEMT device as claimed in claim 5, wherein the first depth is less than the second depth.

8. The method for fabricating a HEMT device as claimed in claim 5, wherein the first depth is equal to the second depth.

9. The method for fabricating a HEMT device as claimed in claim 1, wherein the first implant region has an implant concentration ranging from 1E10 to 1E16.

10. The method for fabricating a HEMT device as claimed in claim 1, wherein the second implant region has an implant concentration ranging from 1E10 to 1E16.

11. The method for fabricating a HEMT device as claimed in claim 1, wherein an angle between the bottom and the sidewall of the first trench is greater than or equal to 90 degrees.

12. The method for fabricating a HEMT device as claimed in claim 1, wherein an angle between the bottom and the sidewall of the second trench is greater than or equal to 90 degrees.

* * * * *